(12) United States Patent
Zhao

(10) Patent No.: US 8,897,730 B2
(45) Date of Patent: Nov. 25, 2014

(54) RADIO FREQUENCY SWITCH CIRCUIT

(71) Applicant: TriQuint Semiconductor, Inc., Hillsboro, OH (US)

(72) Inventor: Jun Zhao, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 154 days.

(21) Appl. No.: 13/731,991

(22) Filed: Dec. 31, 2012

(65) Prior Publication Data

US 2014/0187175 A1    Jul. 3, 2014

(51) Int. Cl.
*H01Q 11/12* (2006.01)
*H04B 1/04* (2006.01)
*H03F 3/189* (2006.01)
*H03F 3/68* (2006.01)

(52) U.S. Cl.
CPC . *H03F 3/189* (2013.01); *H03F 3/68* (2013.01)
USPC .................. 455/127.4; 455/127.3; 455/552.1; 330/126; 330/295

(58) Field of Classification Search
USPC .................. 455/73, 126, 127.1, 127.2, 127.3, 455/127.4, 552.1, 553.1; 330/51, 124 R, 330/126, 295
See application file for complete search history.

(56) References Cited

U.S. PATENT DOCUMENTS

| | | | |
|---|---|---|---|
| 5,541,554 A | 7/1996 | Stengel et al. | |
| 6,078,794 A * | 6/2000 | Peckham et al. | 455/127.4 |
| 6,091,966 A * | 7/2000 | Meadows | 455/553.1 |
| 6,313,700 B1 * | 11/2001 | Nishijima et al. | 330/51 |
| 7,023,272 B2 | 4/2006 | Hung et al. | |
| 7,482,868 B2 | 1/2009 | Hageman et al. | |
| 8,461,931 B1 * | 6/2013 | Bayruns et al. | 330/297 |
| 8,710,927 B2 * | 4/2014 | Kamitani et al. | 330/295 |
| 8,736,378 B1 * | 5/2014 | Hau | 330/302 |

* cited by examiner

*Primary Examiner* — Quochien B Vuong
(74) *Attorney, Agent, or Firm* — Schwabe Williamson & Wyatt

(57) ABSTRACT

Embodiments provide a radio frequency (RF) power amplifier (PA) circuit having a high-power mode and a low-power mode. The RF PA circuit may include a high-power amplifier to provide an amplified RF signal on a first path, and a low-power amplifier to provide an amplified RF signal on a second path. The first path and second path may intersect at a junction node. A switch may be coupled between the low-power amplifier and the junction node to switch the circuit between the high-power mode and the low-power mode. A matching circuit may be coupled on the second path to match an output impedance of the low-power amplifier to a junction impedance of the junction node at a fundamental frequency of the RF signal, and to present an open circuit at a third harmonic of the RF signal. The matching circuit may facilitate high efficiency for the RF PA circuit.

20 Claims, 3 Drawing Sheets

RADIO FREQUENCY SWITCH CIRCUIT

FIELD

Embodiments of the present disclosure relate generally to the field of circuits, and more particularly to radio frequency switching circuits.

BACKGROUND

Radio frequency (RF) power amplifiers are used to amplify an RF signal, such as for transmission over a wireless network. Some RF power amplifiers are switchable between a low-power mode and a high-power mode that provide different amplification gain. A switch is typically placed at the output of the low power mode to provide isolation during the high power mode and to pass the RF signal during the low power mode. However, the switch provides low isolation and a variable impedance at the third harmonic of the RF signal, which causes the RF power amplifier to have a low efficiency.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1:
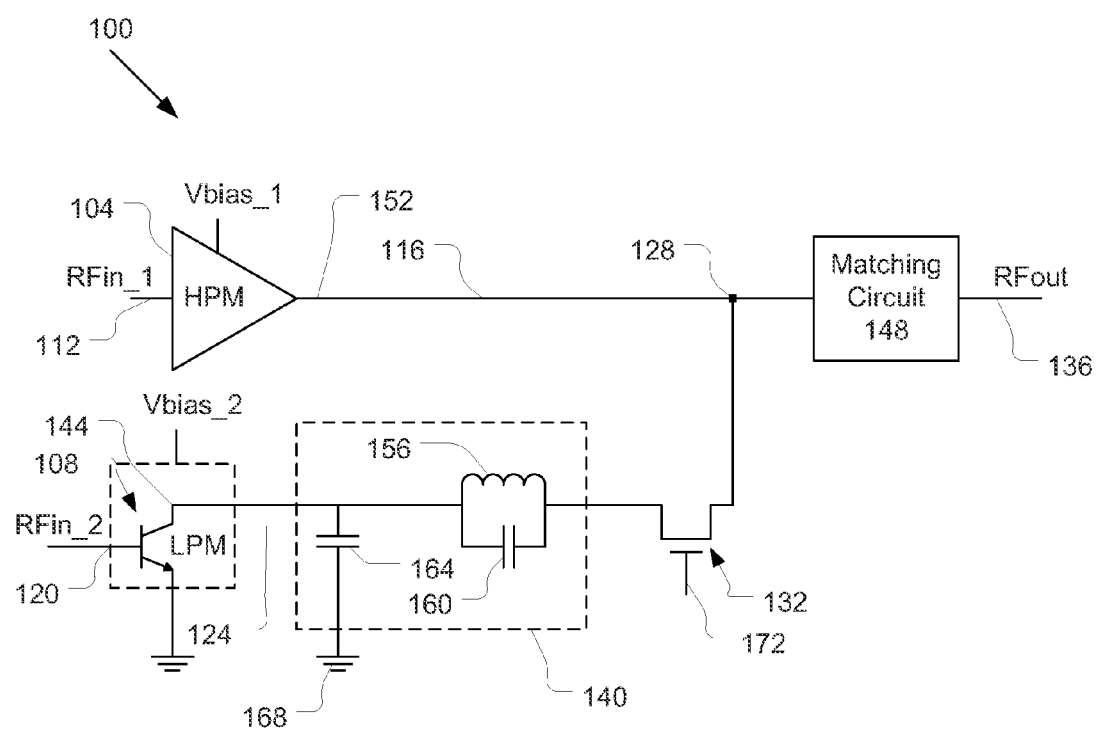
FIG. 1 illustrates a circuit diagram of a radio frequency (RF) power amplifier circuit in accordance with various embodiments.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A. B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Various embodiments may provide a dual-mode radio frequency (RF) power amplifier (PA) circuit. The RF PA circuit may have a high-power mode and a low-power mode. The RF PA circuit may include a high-power amplifier to provide a first amplified RF signal on a first path during the high-power mode, and a low-power amplifier to provide a second amplified RF signal on a second path during the low-power mode. The first path and second path may intersect at a junction node. The RF PA circuit may further include a switching device to switch the circuit between the high-power mode and the low-power mode. In some embodiments, the switching device may include a switch (e.g., including one or more transistors) coupled between the low-power amplifier and the junction node. Additionally, or alternatively, the switching device may control a first bias voltage used to control the high-power amplifier and a second bias voltage used to control the low-power amplifier. The first bias voltage may turn the high-power amplifier on during the high-power mode and turn the high-power amplifier off during the low-power mode. The second bias voltage may turn the low-power amplifier off during the high-power mode and turn the low-power amplifier on during the low-power mode.

In various embodiments, a matching circuit may be coupled on the second path to match an output impedance of the low-power amplifier to a junction impedance of the junction node at a fundamental frequency of the RF signal, and to present an open circuit at a third harmonic of the RF signal. The matching circuit may facilitate high efficiency for the RF PA circuit.

FIG. 1 illustrates an RF PA circuit 100 (hereinafter circuit 100") in accordance with various embodiments. Circuit 100 may include a high-power amplifier 104 and a low-power amplifier 108. The circuit 100 may be switchable between a high-power mode and a low-power mode. During the high-power mode, the high-power amplifier 104 may receive a first RF input signal, RFin_1, at a high-power mode (HPM) input terminal 112, and may amplify the RF input signal on a first path 116 (also referred to as the high-power path 116). During the low-power mode, the low-power amplifier 108 may receive a second RF input signal, RFin_2, at a low-power mode (LPM) input terminal 120, and may amplify the RF input signal on a second path 124 (also referred to as the low-power path 124). The first path 116 and second path 124 may intersect at a junction node 128.

In various embodiments, the circuit 100 may include a switching device to switch the circuit 100 between the high-power rode and the low-power mode. In some embodiments, the switching device may include a switch 132 coupled between the low-power amplifier 108 and the junction node 128 to switch the circuit 100 between the high-power mode and the low-power mode. The switch 132 may be open (off) during the high-power mode, and may be closed (on) during the low-power mode. Additionally, or alternatively, the switching device may control a first bias voltage, Vbias_1, to control the high-power amplifier 104 and/or a second bias voltage, Vbias_2, to control the low-power amplifier 108. The first bias voltage, Vbias_1, may turn the high-power amplifier 104 on during the high-power mode and turn the high-power amplifier 104 off during the low-power mode. The second bias voltage, Vbias_2, may turn the low-power amplifier 108 off during the high-power mode and turn the low-power amplifier 108 on during the low-power mode. In some embodiments, the circuit 100 may not include the switch 132, and the second bias voltage may be used to control the low-power amplifier 108 to switch between the high-power mode and the low-power mode. In other embodiments, the second bias voltage may be used in addition to the switch 132. In yet other embodiments, the circuit 100 may include the switch 132 but not use the second bias voltage to turn off the low-power amplifier 108 during the high-power mode. In these embodiments, the low-power amplifier 108 may be biased on during both the low-power mode and the high-power mode.

The circuit 100 may pass an RF output signal, RFout, to an output terminal 136. The RF output signal may be the first RF input signal amplified by the high-power amplifier 104 during the high-power mode, and may be the second RF input signal amplified by the low-power amplifier 108 during the low-power mode. In some embodiments, the first and second RF input signals may be substantially the same signal (e.g., at a given time). The high-power amplifier 104 and low-power amplifier 108 may apply different amplification gains to the RF input signal to provide the RF output signal with a higher output power in the high-power mode compared with the output power in the low-power mode. In some embodiments, the high-power amplifier 104 may receive the first RF input signal and the low-power amplifier 108 may receive the second RF input signal in both the high-power mode and the low-power mode. In other embodiments, the circuit 100 may include an input switch (not shown) to selectively pass the RF input signal to the HPM input terminal 112 during the high-power mode and/or to selectively pass the RF input signal to the LPM input terminal 120 during the low-power mode. The input switch may be used in addition to the first and/or second bias voltages.

In some embodiments, the circuit 100 may one or more other modes in addition to the high-power mode and the low-power mode. For example, in some embodiments, the circuit 100 may include a third mode in which both the high-power amplifier 104 and low-power amplifier 108 are active.

In various embodiments, the circuit 100 may further include a matching circuit 140 (also referred to as the low-power mode (LPM) matching circuit 140) coupled between the junction node 128 and the low-power amplifier 108. At a fundamental frequency of the second RF input signal (which may be equal to the fundamental frequency of the first RF input signal and/or the RF output signal), the matching circuit 140 may convert an output impedance at an LPM output node 144 of the low-power amplifier 108 to a junction impedance at the junction node 128. This may facilitate efficient pass-through of the amplified second RF input signal to the output terminal 136 during the low-power mode. In some embodiments, the impedance at the LPM output node 144 of the low-power amplifier 108 may be higher than the junction impedance at the junction node 128.

In various embodiments, the matching circuit 140 may present an open circuit at a third harmonic of the first RF input signal (e.g., three times the fundamental frequency). The third harmonic of the first RF input signal may be equal to the third harmonic of the second RF input signal and/or the RF output signal. The open circuit may provide isolation of the second path 124 from the first path 116 at the third harmonic of the first RF input signal during the high-power mode.

In conventional RF PA circuits which do not present an open circuit at the third harmonic on the low-power path during the high-power mode, the switch presents a variable impedance at the third harmonic of the RF input signal, thereby causing impedance spreading of the termination load on the low power path as seen from the junction node. At the third harmonic, the loading of the power amplifier is relatively high (compared with the first and second harmonics), while the impedance of the low-power mode switch and matching circuit is relatively low. This combination results in distortion of the power amplifier load at the third harmonic, which causes signal loss and makes impedance matching difficult. Accordingly, the efficiency of the RF PA circuit is negatively affected.

In contrast, the matching circuit 140 as described herein may provide a high impedance (e.g., termination impedance) at the third harmonic on the low-power path (e.g., second path 124) as viewed from the junction node 128. This may facilitate isolation of the second path 124 during the high-power rode (e.g., when the switch 132 is open). Accordingly, the efficiency (e.g. power-added efficiency (PAE)) of the circuit 100 may be increased compared with prior RF PA circuits. The matching circuit 140 may provide impedance matching at the fundamental frequency of the second RF input signal to efficiently pass the amplified second RF input signal to the output terminal 136 during the low-power mode.

In various embodiments, the circuit 140 may further include a matching circuit 148 (also referred to as a high-power mode (HPM) matching circuit 148) to match an impedance at an HPM output node 152 of the high-power amplifier 104 to the output impedance at the output terminal 136. In some embodiments, as shown in FIG. 1, the matching circuit 148 may be coupled between the junction node 128 and the output terminal 136. The HPM matching circuit 148 may match the junction impedance at the junction node 128 to the output impedance at the output terminal 136. In other embodiments, the HPM matching circuit 148 may be coupled between the HPM output node 152 and the junction node 128.

In some embodiments, as shown in FIG. 1, the matching circuit 140 may include an inductor 156 and a capacitor 160 coupled with one another in parallel along the second path 124. The inductor 156 and capacitor 160 may resonate at the third harmonic of the first and/or second RF input signal to present the open circuit. In some embodiments, the matching circuit 140 may further include a shunt capacitor 164 coupled in shunt with the second path 124 (e.g., between the second path 124 and a ground terminal 168). Other embodiments of the matching circuit 140 may include other suitable components and/or another arrangement of components to provide the impedance matching at the fundamental frequency of the second RF input signal and the open circuit at the third harmonic of the first RF input signal.

In some embodiments, the parallel inductor-capacitor pair formed by inductor 156 and capacitor 160 may pass through RF signals at the second harmonic of the first and/or second RF input signals. The parallel inductor-capacitor pair may present an inductance at frequencies below the third harmonic (e.g., at the fundamental frequency and the second harmonic).

In various embodiments, the switch 132 may receive a control signal at a control terminal 172 to open or close the switch 132. In some embodiments, the switch 132 may include one or more transistors. Other embodiments may include any other suitable structure for switching an RF signal.

In some embodiments, the low-power amplifier 108 may include one or more transistors. For example, the HPM amplifier may include heterojunction bipolar transistor (HBT), as shown in FIG. 1, with the base coupled to with input terminal 120 to receive the RF input signal and the collector coupled with the LPM output node 144 to output the amplified RF input signal. Other embodiments may include any other suitable structure for amplifying an RF signal.

In some embodiments, the high-power amplifier 104 may include one or more transistors. Other embodiments may include any other suitable structure for amplifying an RF signal. The high-power amplifier 104 may have a gain that is higher than the low-power amplifier 108.

Figure 2:
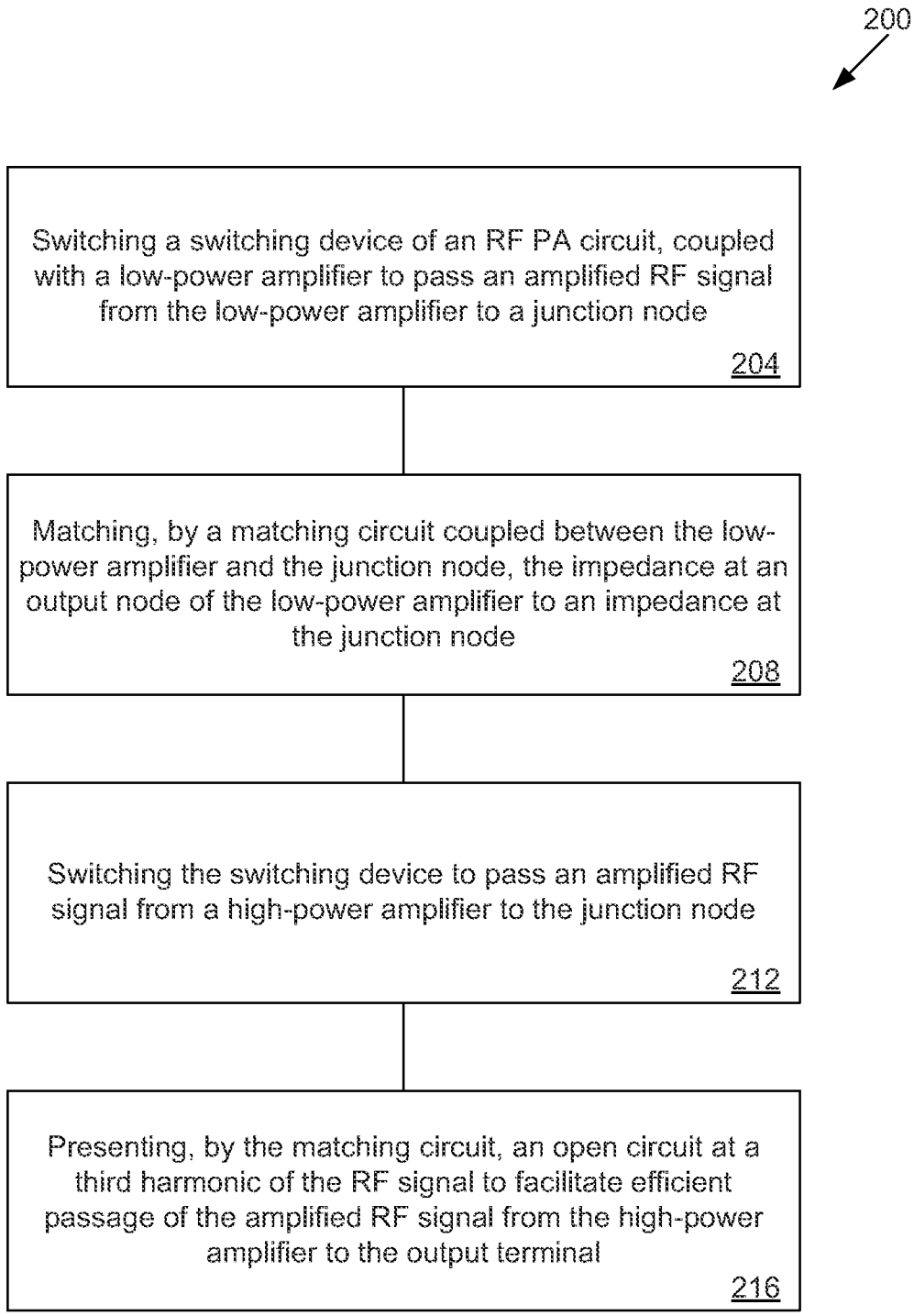
FIG. 2 illustrates a flow chart of a method for switching between a low-power mode and a high-power mode of an RF power amplifier circuit in accordance with various embodiments.

FIG. 2 illustrates a method 200 of switching between a low-power mode and a high-power mode of an RF PA circuit (e.g., circuit 100) in accordance with various embodiments. At block 204, the method 200 may include switching a switching device (e.g., switch 132, first bias voltage Vbias_1, and/or second bias voltage Vbias_2) coupled with a low-power amplifier to pass an amplified RF signal (e.g., the amplified second RF input signal RFin_2) from the low-power amplifier to a junction node (e.g., junction node 128). Accordingly, the RF PA circuit may be placed in the low-power mode at 204. In embodiments that include a switch coupled between the low-power amplifier and the junction node, the switch may be dosed (on) during the low-power mode. The amplified RF signal may be passed from the junction node to an output terminal (e.g., output terminal 136) of the RF PA circuit.

The method 200 may further include, at 208, matching, by a matching circuit of the RF PA circuit coupled between the low-power amplifier and the junction node, the impedance at an output node (e.g., LPM output node 144) of the low-power amplifier to an impedance at the junction node to efficiently pass the amplified RF signal to the junction node. In some embodiments, the impedance at the output node of the low-power amplifier may be higher than the impedance at the junction node. In other embodiments, the impedance at the output node of the low-power amplifier may be lower than the impedance at the junction node.

A high-power amplifier (e.g., high-power amplifier 104) of the circuit may be turned off during the low-power mode. For example, the high-power amplifier may receive a bias voltage (e.g., Vbias_1) to turn off the high-power amplifier during the low-power mode.

At 212, the method 200 may further include switching the switching device to pass an amplified RF signal (e.g., amplified first RF input signal RFin_1) from the high-power amplifier to the junction node. The amplified RF signal from the high-power amplifier may be passed from the junction node to the output terminal. Accordingly, the RF PA circuit may be placed in a high-power mode at 212. The high-power amplifier may be turned on (e.g., by the first bias voltage Vbias_1) during the high-power mode to amplify the RF input signal. In embodiments that include a switch coupled between the low-power amplifier and the junction node, the switch may be open (off) during the high-power mode.

At 216, the method 200 may further include presenting, by the matching circuit, an open circuit at a third harmonic of the RF signal to facilitate efficient passage of the amplified RF signal from the high-power amplifier to the output terminal.

Figure 3:
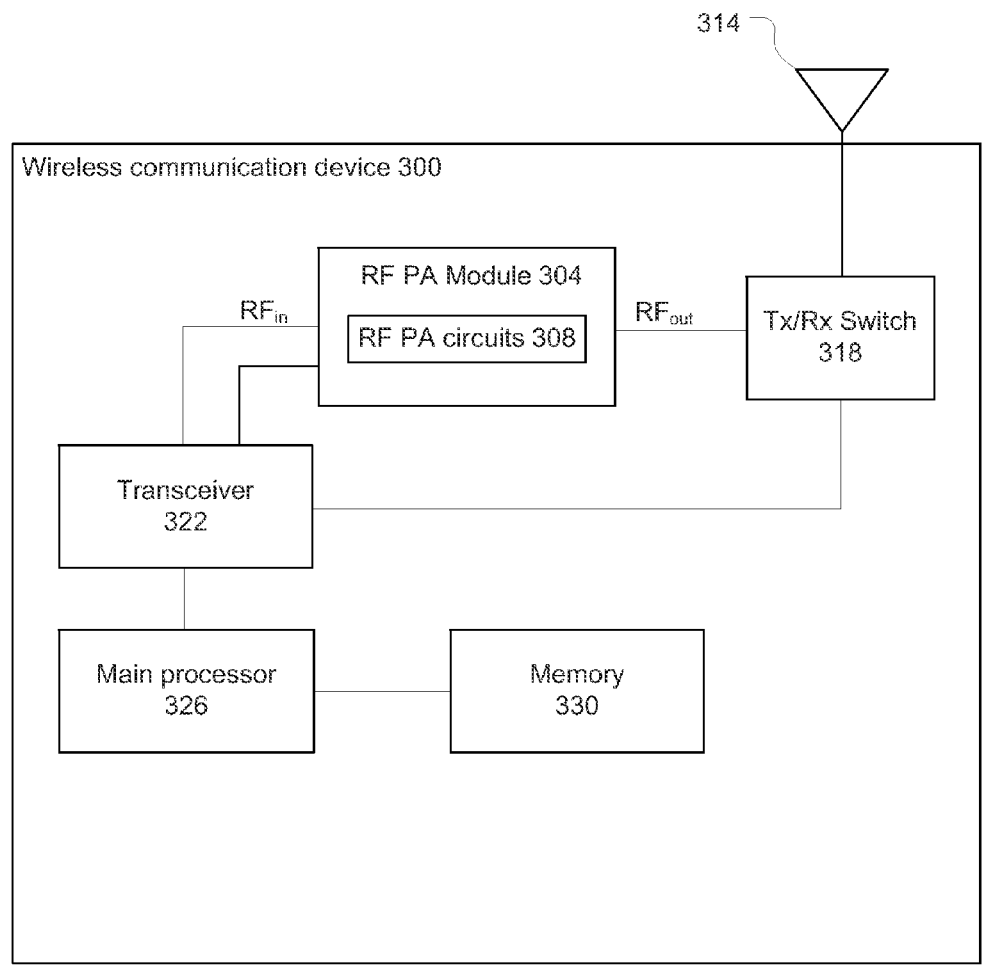
FIG. 3 is a block diagram of an exemplary wireless communication device in accordance with various embodiments.

A block diagram of an exemplary wireless communication device 300 is illustrated in FIG. 3 in accordance with some embodiments. Wireless communication device 300 may have an RF power amplifier (PA) module 304 including one or more RF PA circuits 308. RF PA circuits 308 may be similar to circuit 100. Additionally, or alternatively, the RF PA circuits 308 may be configured to carry out method 200.

In addition to the RF PA module 304, the wireless communication device 300 may have an antenna structure 314, a Tx/Rx switch 318, a transceiver 322, a main processor 326, and a memory 330 coupled with each other at least as shown. While the wireless communication device 300 is shown with transmitting and receiving capabilities, other embodiments may include devices with only transmitting or only receiving capabilities.

In various embodiments, the wireless communication device 300 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 326 may execute a basic operating system program, stored in the memory 330, in order to control the overall operation of the wireless communication device 300. For example, the main processor 326 may control the reception of signals and the transmission of signals by transceiver 322. The main processor 326 may be capable of executing other processes and programs resident in the memory 330 and may move data into or out of memory 330, as desired by an executing process.

The transceiver 322 may receive outgoing data (e.g., voice data, web data, e-mail, signaling data, etc.) from the main processor 326, may generate the $RF_{in}$ signal(s) to represent the outgoing data, and provide the $RF_{in}$ signal(s) to the RF PA module 304. The transceiver 322 may also control the RF PA module 304 to operate in selected bands and in either high-power or low-power modes. In some embodiments, the transceiver 322 may generate the $RF_{in}$ signal(s) using OFDM modulation.

The RF PA module 304 may amplify the $RF_{in}$ signal(s) to provide $RF_{out}$ signal(s) as described herein. The RF PA module 304 may include a high-power mode and a low-power mode, as described herein. The RF PA module 304 may be switched between the high-power mode and low-power mode (e.g., by the transceiver 322), for example, to achieve a desired output power for the $RF_{out}$ signal(s).

The $RF_{out}$ signal(s) may be forwarded to the Tx/Rx switch 318 and then to the antenna structure 314 for an over-the-air (OTA) transmission. In some embodiments, Tx/Rx switch 318 may include a duplexer. In a similar manner, the transceiver 322 may receive an incoming OTA signal from the antenna structure 314 through the Tx/Rx switch 318. The transceiver 322 may process and send the incoming signal to the main processor 326 for further processing.

In various embodiments, the antenna structure 314 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 300 is given by way of example and that, for simplicity and clarity, only so much of the construction and operation of the wireless communication device 300 as is necessary for an understanding of the embodiments is shown and described. Various embodiments contemplate any suitable component or combination of components performing any suitable tasks in association with wireless communication device 300, according to particular needs. Moreover, it is understood that the wireless communication device 300 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. An apparatus comprising:
a first amplifier configured to receive a first radio frequency (RF) signal and to amplify the first RF signal on a first path during a first mode of the apparatus;
a second amplifier configured to receive a second RF signal and to amplify the second RF signal on a second path during a second mode of the apparatus, wherein the second amplifier has a different gain than the first amplifier, and wherein the first and second paths intersect at a junction node;
a switching device coupled with the second amplifier to switch the apparatus between the first mode and the second mode; and
a matching circuit coupled between the junction node and the second amplifier to:
convert, at a fundamental frequency of the second RF signal, an output impedance at an output terminal of the second amplifier to a junction impedance at the junction node; and
present an open circuit at a third harmonic of the first RF signal.

2. The apparatus of claim 1, wherein the first mode is a high-power mode (HPM) and the second mode is a low-power mode (LPM), and wherein the first amplifier has a higher gain than the second amplifier.

3. The apparatus of claim 1, wherein the matching circuit includes an inductor and a capacitor coupled with one another in parallel along the second path.

4. The apparatus of claim 3, wherein the matching circuit further comprises a shunt capacitor coupled in shunt with the second path.

5. The apparatus of claim 3, wherein the inductor and capacitor are configured to resonate at the third harmonic of the first RF signal.

6. The apparatus of claim 1, wherein the matching circuit is a first matching circuit, wherein the apparatus is configured to output an amplified RF signal at an output terminal, and wherein the apparatus further comprises a second matching circuit coupled between the junction node and the output terminal to match the junction impedance at the junction node to an output impedance at the output terminal.

7. The apparatus of claim 1, wherein the switching device includes a transistor coupled between the second transistor and the junction node wherein the transistor is configured to receive a control signal to switch the apparatus between the first mode and the second mode.

8. The apparatus of claim 1, wherein the matching circuit is further configured to pass through RF signals at a second harmonic of the second RF signal.

9. The apparatus of claim 1, wherein the first amplifier is configured to receive a bias voltage to turn on the first amplifier when the apparatus is in the first mode and to turn off the first amplifier when the apparatus is in the second mode, wherein the switching device is configured to control the bias voltage.

10. The apparatus of claim 9, wherein the bias voltage is a first bias voltage, and wherein the second amplifier is configured to receive a second bias voltage to turn off the second amplifier when the apparatus is in the first mode and to turn on the second amplifier when the apparatus is in the second mode, wherein the switching device is configured to control the bias voltage.

11. A circuit comprising:
a first amplifier configured to receive a first radio frequency (RF) input signal and to amplify the first RF signal on a first path during a first mode of the circuit;
a second amplifier configured to receive a second RF signal and to amplify the second RF signal on a second path during a second mode of the circuit, wherein the second path and first path intersect at a junction node;
a switching device coupled with the second amplifier to switch the circuit between the first mode and the second mode;
a matching circuit coupled between the junction node and the second amplifier to convert an impedance at an output terminal of the second amplifier to an impedance at the junction node at a fundamental frequency of the RF signal and to present an open circuit at a third harmonic of the first RF signal, the matching circuit including:
an inductor coupled between an output terminal of the second amplifier and the switch;
a first capacitor coupled in parallel with the inductor; and
a second capacitor coupled between the output terminal of the second amplifier and a ground terminal.

12. The circuit of claim 11, wherein the inductor and the first capacitor are configured to resonate at the third harmonic of the first RF signal.

13. The circuit of claim 11, wherein the first mode is a high-power mode (HPM) and the second mode is a low-power mode (LPM), and wherein the first amplifier has a higher gain than the second amplifier.

14. The circuit of claim 13, wherein matching circuit is a first matching circuit, wherein the circuit is configured to output an amplified RF signal at an RF output terminal, and wherein the circuit further comprises a second matching circuit coupled between the junction node and the RF output terminal to match the impedance at the junction node to an impedance at the RF output terminal.

15. The circuit of claim 11, wherein the switching device includes a transistor coupled between the second amplifier and the junction node.

16. The circuit of claim 11, wherein the first amplifier is configured to receive a first bias voltage to turn on the first amplifier when the apparatus is in the first mode and to turn off the first amplifier when the apparatus is in the second mode, wherein the second amplifier is configured to receive a second bias voltage to turn off the second amplifier when the apparatus is in the first mode and to turn on the second amplifier when the apparatus is in the second mode, and wherein the switching device is configured to control the first and second bias voltages.

17. A system comprising:
one or more antennas;
a transceiver; and
a power amplification module coupled with the one or more antennas and the transceiver, the power amplification module configured to receive radio frequency (RF) signals from the transceiver and provide amplified RF signals to the one or more antennas, wherein the power amplification module is switchable between a high-power mode and a low-power mode, and wherein the power amplification module includes:

a high-power amplifier configured to receive a first RF signal and to amplify the first RF signal on a first path during the high-power mode;
a low-power amplifier configured to receive a second RF signal and to amplify the second RF signal on a second path during the low-power c rode, wherein the first and second paths intersect at a junction node;
a switch coupled between the low-power amplifier and the junction node, the switch configured to be dosed during the low-power mode and open during the high-power mode; and
a matching circuit coupled between the low-power amplifier and the junction node to:
   convert an output impedance at the low-power amplifier to a junction impedance at the junction node at a fundamental frequency of the second RF signal; and
   present an open circuit at a third harmonic of the first RF signal.

18. The system of claim 17, wherein the matching circuit includes:
   an inductor coupled in series with the second path;
   a first capacitor coupled in parallel with the inductor; and
   a second capacitor coupled in shunt with the second path.

19. The system of claim 17, wherein the matching circuit is a first matching circuit, and wherein the power amplification module further comprises a second matching circuit coupled between the junction node and an output terminal of the power amplification module to match the junction impedance at the junction node to an output impedance at the output terminal.

20. The system of claim 17, wherein the system is a user equipment configured to transmit the amplified RF signals over a wireless communication network using the one or more antennas.

* * * * *